(12) United States Patent
Yoo

(10) Patent No.: US 9,716,213 B2
(45) Date of Patent: Jul. 25, 2017

(54) THIN FILM LIGHT EMITTING DIODE

(71) Applicant: LG INNOTEK CO., LTD., Seoul (KR)

(72) Inventor: Myung Cheol Yoo, Pleasanton, CA (US)

(73) Assignee: LG INNOTEK CO., LTD., Seoul (KR)

(*) Notice: Subject to any disclaimer, the term of this patent is extended or adjusted under 35 U.S.C. 154(b) by 0 days.

(21) Appl. No.: 15/008,091

(22) Filed: Jan. 27, 2016

(65) Prior Publication Data

US 2016/0141466 A1    May 19, 2016

Related U.S. Application Data

(60) Continuation of application No. 13/855,637, filed on Apr. 2, 2013, now Pat. No. 9,281,454, which is a
(Continued)

(51) Int. Cl.
*H01L 29/06* (2006.01)
*H01L 33/50* (2010.01)
(Continued)

(52) U.S. Cl.
CPC ............ *H01L 33/504* (2013.01); *H01L 24/49* (2013.01); *H01L 33/06* (2013.01); *H01L 33/32* (2013.01);
(Continued)

(58) Field of Classification Search
CPC ........ H01L 33/504; H01L 33/06; H01L 24/49
See application file for complete search history.

(56) References Cited

U.S. PATENT DOCUMENTS 2,913,358 A    11/1959 Harrington et al.
2,981,877 A    4/1961 Noyce
(Continued)

FOREIGN PATENT DOCUMENTS

CA    2340968    9/2001
CA    2375069    11/2001
(Continued)

OTHER PUBLICATIONS

Mensz, "$In_xGa1_{-x}N/Al_yGa_{1-y}N$ violet light emitting diodes with reflective p-contacts for high single sided light extraction", Electronics Letters, vol. 33, No. 24, Nov. 20, 1997, pp. 2066-2068.
(Continued)

*Primary Examiner* — Marc Armand
*Assistant Examiner* — Sarah Salerno
(74) *Attorney, Agent, or Firm* — Birch, Stewart, Kolasch & Birch, LLP

(57) ABSTRACT

Light emitting devices comprise a substrate having a surface and a side surface; a semiconductor structure on the surface of the substrate, the semiconductor structure having a first surface, a second surface and a side surface, wherein the second surface is opposite the first surface, wherein the first surface, relative to the second surface, is proximate to the substrate, and wherein the semiconductor structure comprises a first-type layer, a light emitting layer and a second-type layer; a first and a second electrodes; and a wavelength converting element arranged on the side surface of the semiconductor structure, wherein the wavelength converting element has an open space, and wherein the open space is a portion not covered by the wavelength converting element.

21 Claims, 5 Drawing Sheets

Related U.S. Application Data continuation of application No. 12/591,165, filed on Nov. 10, 2009, now Pat. No. 8,445,921, which is a continuation of application No. 11/978,680, filed on Oct. 30, 2007, now Pat. No. 7,649,210, which is a continuation of application No. 10/975,095, filed on Oct. 28, 2004, now Pat. No. 7,691,650, which is a division of application No. 10/179,010, filed on Jun. 26, 2002, now Pat. No. 6,841,802.

(51) Int. Cl.
   *H01L 33/44* (2010.01)
   *H01L 33/62* (2010.01)
   *H01L 23/00* (2006.01)
   *H01L 33/06* (2010.01)
   *H01L 33/32* (2010.01)
   *H01L 33/40* (2010.01)

(52) U.S. Cl.
   CPC ............ *H01L 33/405* (2013.01); *H01L 33/44* (2013.01); *H01L 33/502* (2013.01); *H01L 33/507* (2013.01); *H01L 33/62* (2013.01); H01L 2224/48463 (2013.01); H01L 2224/4918 (2013.01); H01L 2224/49107 (2013.01); H01L 2224/8592 (2013.01); H01L 2924/00014 (2013.01); H01L 2924/01029 (2013.01); H01L 2924/12041 (2013.01); H01L 2924/12042 (2013.01); H01L 2924/181 (2013.01)

(56) References Cited

U.S. PATENT DOCUMENTS

| | | |
|---|---|---|
| 3,602,982 A | 9/1971 | Kooi |
| 3,774,086 A | 11/1973 | Vincent, Jr. |
| 3,875,456 A | 4/1975 | Kano et al. |
| 3,907,620 A | 9/1975 | Abraham et al. |
| 4,141,135 A | 2/1979 | Henry et al. |
| 4,406,052 A | 9/1983 | Cogan |
| 4,634,926 A | 1/1987 | Vriens et al. |
| 4,647,812 A | 3/1987 | Vriens et al. |
| 4,882,617 A | 11/1989 | Vriens |
| 4,918,497 A | 4/1990 | Edmond |
| 5,027,168 A | 6/1991 | Edmond |
| 5,034,068 A | 7/1991 | Glenn et al. |
| 5,040,044 A | 8/1991 | Noguchi et al. |
| 5,162,876 A | 11/1992 | Kitagawa et al. |
| 5,198,795 A | 3/1993 | Shibasaki et al. |
| 5,210,051 A | 5/1993 | Carter, Jr. |
| 5,382,452 A | 1/1995 | Bruno et al. |
| 5,454,915 A | 10/1995 | Shor et al. |
| 5,504,036 A | 4/1996 | Dekker et al. |
| 5,523,589 A | 6/1996 | Edmond et al. |
| 5,554,418 A | 9/1996 | Ito et al. |
| 5,585,648 A | 12/1996 | Tischler |
| 5,592,501 A | 1/1997 | Edmond et al. |
| 5,620,557 A | 4/1997 | Manabe et al. |
| 5,631,664 A | 5/1997 | Adachi et al. |
| 5,644,190 A | 7/1997 | Potter |
| 5,661,074 A | 8/1997 | Tischler |
| 5,684,309 A | 11/1997 | McIntosh et al. |
| 5,693,963 A | 12/1997 | Fujimoto et al. |
| 5,707,745 A | 1/1998 | Forrest et al. |
| 5,729,029 A | 3/1998 | Rudaz |
| 5,739,554 A | 4/1998 | Edmond et al. |
| 5,744,233 A | 4/1998 | Opitz et al. |
| 5,786,606 A | 7/1998 | Nishio et al. |
| 5,798,537 A | 8/1998 | Nitta |
| 5,804,834 A | 9/1998 | Shimoyama et al. |
| 5,813,752 A | 9/1998 | Singer et al. |
| 5,813,753 A | 9/1998 | Vriens et al. |
| 5,847,507 A | 12/1998 | Butterworth et al. |
| 5,874,747 A | 2/1999 | Redwing et al. |
| 5,929,466 A | 7/1999 | Ohba et al. |
| 5,930,653 A | 7/1999 | Gaal |
| 5,959,307 A | 9/1999 | Nakamura et al. |
| 5,959,316 A | 9/1999 | Lowery |
| 5,972,781 A | 10/1999 | Wegleiter et al. |
| 5,990,500 A | 11/1999 | Okazaki |
| 5,998,925 A | 12/1999 | Shimizu et al. |
| 6,025,251 A | 2/2000 | Jakowetz et al. |
| 6,041,515 A | 3/2000 | Ally et al. |
| 6,043,515 A | 3/2000 | Kamiguchi et al. |
| 6,066,861 A | 5/2000 | Höhn et al. |
| 6,067,309 A | 5/2000 | Onomura et al. |
| 6,069,440 A | 5/2000 | Shimizu et al. |
| 6,071,795 A | 6/2000 | Cheung et al. |
| 6,078,064 A | 6/2000 | Ming-Jiunn et al. |
| 6,093,965 A | 7/2000 | Nakamura et al. |
| 6,096,570 A | 8/2000 | Hattori |
| 6,100,104 A | 8/2000 | Haerle |
| 6,100,545 A | 8/2000 | Chiyo et al. |
| 6,120,600 A | 9/2000 | Edmond et al. |
| 6,133,589 A | 10/2000 | Krames et al. |
| 6,146,916 A | 11/2000 | Nanishi et al. |
| 6,155,699 A | 12/2000 | Miller et al. |
| 6,172,382 B1 | 1/2001 | Nagahama et al. |
| 6,177,684 B1 | 1/2001 | Sugiyama |
| 6,229,160 B1 | 5/2001 | Krames et al. |
| 6,245,259 B1 | 6/2001 | Höhn et al. |
| 6,252,254 B1 | 6/2001 | Soules et al. |
| 6,255,670 B1 | 7/2001 | Srivastava et al. |
| 6,277,301 B1 | 8/2001 | Höhn et al. |
| 6,278,136 B1 | 8/2001 | Nitta |
| 6,281,526 B1 | 8/2001 | Nitta et al. |
| 6,294,800 B1 | 9/2001 | Duggal et al. |
| 6,303,404 B1 | 10/2001 | Moon et al. |
| 6,303,405 B1 | 10/2001 | Yoshida et al. |
| 6,310,351 B1 | 10/2001 | Zur |
| 6,320,206 B1 | 11/2001 | Coman et al. |
| 6,326,294 B1 | 12/2001 | Jang et al. |
| 6,329,216 B1 | 12/2001 | Matsumoto et al. |
| 6,335,217 B1 | 1/2002 | Chiyo et al. |
| 6,337,536 B1 | 1/2002 | Matsubara et al. |
| 6,339,010 B2 | 1/2002 | Sameshima |
| 6,340,824 B1 | 1/2002 | Komoto et al. |
| 6,350,998 B1 | 2/2002 | Tsuji |
| 6,358,770 B2 | 3/2002 | Itoh et al. |
| 6,365,429 B1 | 4/2002 | Kneissl et al. |
| 6,388,275 B1 | 5/2002 | Kano |
| 6,388,378 B1 | 5/2002 | Törnqvist et al. |
| 6,395,572 B1 | 5/2002 | Tsutsui et al. |
| 6,409,938 B1 | 6/2002 | Comanzo |
| 6,417,019 B1 | 7/2002 | Mueller et al. |
| 6,426,512 B1 | 7/2002 | Ito et al. |
| 6,429,583 B1 | 8/2002 | Levinson et al. |
| 6,445,007 B1 | 9/2002 | Wu et al. |
| 6,455,340 B1 | 9/2002 | Chua et al. |
| 6,466,135 B1 | 10/2002 | Srivastava et al. |
| 6,468,824 B2 | 10/2002 | Chen et al. |
| 6,472,765 B1 | 10/2002 | Sano et al. |
| 6,479,836 B1 | 11/2002 | Suzuki et al. |
| 6,479,839 B2 | 11/2002 | Nikolaev et al. |
| 6,486,499 B1 | 11/2002 | Krames et al. |
| 6,495,894 B2 | 12/2002 | Shibata et al. |
| 6,500,689 B2 | 12/2002 | Uemura et al. |
| 6,500,869 B1 | 12/2002 | Driller et al. |
| 6,501,100 B1 | 12/2002 | Srivastava et al. |
| 6,501,102 B2 | 12/2002 | Mueller-Mach et al. |
| 6,504,181 B2 | 1/2003 | Furukawa et al. |
| 6,507,049 B1 | 1/2003 | Yeager et al. |
| 6,508,878 B2 | 1/2003 | Kim et al. |
| 6,509,651 B1 | 1/2003 | Matsubara et al. |
| 6,510,195 B1 | 1/2003 | Chappo et al. |
| 6,515,306 B2 | 2/2003 | Kuo et al. |
| 6,518,079 B2 | 2/2003 | Imler |
| 6,518,600 B1 | 2/2003 | Shaddock |
| 6,521,915 B2 | 2/2003 | Odaki et al. |
| 6,522,065 B1 | 2/2003 | Srivastava et al. |
| 6,538,371 B1 | 3/2003 | Duggal et al. |
| 6,551,848 B2 | 4/2003 | Kwak et al. |
| 6,555,405 B2 | 4/2003 | Chen et al. |

(56) References Cited

U.S. PATENT DOCUMENTS

| | | |
|---|---|---|
| 6,559,075 B1 | 5/2003 | Kelly et al. |
| 6,562,648 B1 | 5/2003 | Wong et al. |
| 6,576,488 B2 | 6/2003 | Collins, III et al. |
| 6,576,930 B2 | 6/2003 | Reeh et al. |
| 6,580,097 B1 | 6/2003 | Soules et al. |
| 6,586,874 B1 | 7/2003 | Komoto et al. |
| 6,586,875 B1 | 7/2003 | Chen et al. |
| 6,589,808 B2 | 7/2003 | Chiyo et al. |
| 6,592,780 B2 | 7/2003 | Höhn et al. |
| 6,600,175 B1 | 7/2003 | Baretz et al. |
| 6,603,146 B1 | 8/2003 | Hata et al. |
| 6,603,258 B1 | 8/2003 | Mueller-Mach et al. |
| 6,613,247 B1 | 9/2003 | Höhn et al. |
| 6,614,060 B1 | 9/2003 | Wang et al. |
| 6,614,170 B2 | 9/2003 | Wang et al. |
| 6,614,172 B2 | 9/2003 | Chiu et al. |
| 6,614,179 B1 | 9/2003 | Shimizu et al. |
| 6,617,401 B2 | 9/2003 | Rubinsztajn |
| 6,620,643 B1 | 9/2003 | Koike |
| 6,621,211 B1 | 9/2003 | Srivastava et al. |
| 6,624,491 B2 | 9/2003 | Waitl et al. |
| 6,627,921 B2 | 9/2003 | Wong et al. |
| 6,635,363 B1 | 10/2003 | Duclos et al. |
| 6,639,925 B2 | 10/2003 | Niwa et al. |
| 6,639,928 B2 | 10/2003 | Marion |
| 6,642,618 B2 | 11/2003 | Yagi et al. |
| 6,642,652 B2 | 11/2003 | Collins, III et al. |
| 6,649,943 B2 | 11/2003 | Shibata et al. |
| 6,650,044 B1 | 11/2003 | Lowery |
| 6,661,030 B2 | 12/2003 | Komoto et al. |
| 6,669,866 B1 | 12/2003 | Kummer et al. |
| 6,674,097 B2 | 1/2004 | Komoto et al. |
| 6,677,173 B2 | 1/2004 | Ota |
| 6,685,852 B2 | 2/2004 | Setlur et al. |
| 6,693,935 B2 | 2/2004 | Tojo et al. |
| 6,696,703 B2 | 2/2004 | Mueller-Mach et al. |
| 6,711,191 B1 | 3/2004 | Kozaki et al. |
| 6,711,192 B1 | 3/2004 | Chikuma et al. |
| 6,711,426 B2 | 3/2004 | Benaron et al. |
| 6,734,467 B2 | 5/2004 | Schlereth et al. |
| 6,734,468 B2 | 5/2004 | Uemura et al. |
| 6,735,230 B1 | 5/2004 | Tanabe et al. |
| 6,744,196 B1 | 6/2004 | Jeon |
| 6,746,889 B1 | 6/2004 | Eliashevich et al. |
| 6,747,406 B1 | 6/2004 | Bortscheller et al. |
| 6,756,731 B1 | 6/2004 | Sano |
| 6,759,688 B2 | 7/2004 | Preston et al. |
| 6,765,232 B2 | 7/2004 | Kaminishi et al. |
| 6,774,401 B2 | 8/2004 | Nakada et al. |
| 6,774,405 B2 | 8/2004 | Yasukawa et al. |
| 6,784,463 B2 | 8/2004 | Camras et al. |
| 6,791,119 B2 | 9/2004 | Slater, Jr. et al. |
| 6,791,259 B1 | 9/2004 | Stokes et al. |
| 6,798,136 B2 | 9/2004 | Sommers |
| 6,803,603 B1 | 10/2004 | Nitta et al. |
| 6,812,500 B2 | 11/2004 | Reeh et al. |
| 6,815,725 B2 | 11/2004 | Sugawara et al. |
| 6,815,728 B2 | 11/2004 | Tsuda et al. |
| 6,818,531 B1 | 11/2004 | Yoo et al. |
| 6,841,802 B2 | 1/2005 | Yoo |
| 6,846,686 B2 | 1/2005 | Saeki et al. |
| 6,869,820 B2 | 3/2005 | Chen |
| 6,873,634 B2 | 3/2005 | Onomura et al. |
| 6,876,003 B1 | 4/2005 | Nakamura et al. |
| 6,876,005 B2 | 4/2005 | Hsieh et al. |
| 6,878,563 B2 | 4/2005 | Bader et al. |
| 6,878,971 B2 | 4/2005 | Uemura |
| 6,890,234 B2 | 5/2005 | Bortscheller et al. |
| 6,891,203 B2 | 5/2005 | Kozawa et al. |
| 6,949,395 B2 | 9/2005 | Yoo |
| 6,960,488 B2 | 11/2005 | Brosnihan et al. |
| 6,992,334 B1 | 1/2006 | Wierer, Jr. et al. |
| 6,995,510 B2 | 2/2006 | Murakami et al. |
| 7,005,198 B2 | 2/2006 | Yano et al. |
| 7,029,935 B2 | 4/2006 | Negley et al. |
| 7,049,159 B2 | 5/2006 | Lowery |
| 7,067,849 B2 | 6/2006 | Yoo |
| 7,078,732 B1 | 7/2006 | Reeh et al. |
| 7,105,370 B2 | 9/2006 | Bader et al. |
| 7,125,737 B2 | 10/2006 | Edmond et al. |
| 7,126,162 B2 | 10/2006 | Reeh et al. |
| 7,148,520 B2 | 12/2006 | Yoo |
| 7,151,283 B2 | 12/2006 | Reeh et al. |
| 7,164,158 B2 | 1/2007 | Stein et al. |
| 7,170,101 B2 | 1/2007 | Tatsumi et al. |
| 7,193,246 B1 | 3/2007 | Tanizawa et al. |
| 7,202,506 B1 | 4/2007 | DenBaars et al. |
| 7,235,189 B2 | 6/2007 | Höhn et al. |
| 7,242,025 B2 | 7/2007 | Eisert et al. |
| 7,250,638 B2 | 7/2007 | Lee et al. |
| 7,265,392 B2 | 9/2007 | Hahn et al. |
| 7,276,736 B2 | 10/2007 | Höhn et al. |
| 7,319,247 B2 | 1/2008 | Bader et al. |
| 7,345,317 B2 | 3/2008 | Reeh et al. |
| 7,365,369 B2 | 4/2008 | Nakamura et al. |
| 7,371,597 B2 | 5/2008 | Yoo |
| 7,402,838 B2 | 7/2008 | Tanizawa et al. |
| 7,432,642 B2 | 10/2008 | Murazaki |
| 7,514,721 B2 | 4/2009 | Krames et al. |
| 7,588,998 B2 | 9/2009 | Fehrer et al. |
| 7,601,550 B2 | 10/2009 | Bogner et al. |
| 7,629,621 B2 | 12/2009 | Reeh et al. |
| 7,649,210 B2 | 1/2010 | Yoo |
| 7,691,650 B2 | 4/2010 | Yoo |
| 7,709,851 B2 | 5/2010 | Bader et al. |
| 7,709,852 B2 | 5/2010 | Höhn et al. |
| 7,939,844 B2 | 5/2011 | Hahn et al. |
| 7,956,364 B2 | 6/2011 | Yoo |
| 8,071,996 B2 | 12/2011 | Höhn et al. |
| 2001/0000622 A1 | 5/2001 | Reeh et al. |
| 2001/0002049 A1 | 5/2001 | Reeh et al. |
| 2001/0004112 A1 | 6/2001 | Furukawa et al. |
| 2001/0014391 A1 | 8/2001 | Forrest et al. |
| 2001/0019134 A1 | 9/2001 | Chang et al. |
| 2001/0028053 A1 | 10/2001 | Hohn et al. |
| 2001/0028062 A1 | 10/2001 | Uemura et al. |
| 2001/0030326 A1 | 10/2001 | Reeh et al. |
| 2001/0042866 A1 | 11/2001 | Coman et al. |
| 2001/0045647 A1 | 11/2001 | Höhn et al. |
| 2001/0050371 A1 | 12/2001 | Odaki et al. |
| 2002/0000643 A1 | 1/2002 | Uemura et al. |
| 2002/0003233 A1 | 1/2002 | Mueller-Mach et al. |
| 2002/0030444 A1 | 3/2002 | Muller-Mach et al. |
| 2002/0043926 A1 | 4/2002 | Takahashi et al. |
| 2002/0079506 A1 | 6/2002 | Komoto et al. |
| 2002/0084745 A1 | 7/2002 | Wang et al. |
| 2002/0084748 A1 | 7/2002 | Ayala et al. |
| 2002/0088985 A1 | 7/2002 | Komoto et al. |
| 2002/0123164 A1 | 9/2002 | Slater, Jr. et al. |
| 2002/0137244 A1 | 9/2002 | Chen et al. |
| 2002/0145147 A1 | 10/2002 | Chiou et al. |
| 2002/0163302 A1 | 11/2002 | Nitta et al. |
| 2002/0187571 A1 | 12/2002 | Collins, III et al. |
| 2003/0077847 A1 | 4/2003 | Yoo |
| 2003/0102473 A1 | 6/2003 | Chason et al. |
| 2003/0122144 A1 | 7/2003 | Uemura et al. |
| 2003/0168664 A1 | 9/2003 | Hahn et al. |
| 2003/0189212 A1 | 10/2003 | Yoo |
| 2003/0189215 A1 | 10/2003 | Lee et al. |
| 2003/0205714 A1 | 11/2003 | Sugawara et al. |
| 2004/0016908 A1 | 1/2004 | Hohn et al. |
| 2004/0033638 A1 | 2/2004 | Bader et al. |
| 2004/0051105 A1 | 3/2004 | Tsuda et al. |
| 2004/0056254 A1 | 3/2004 | Bader et al. |
| 2004/0084687 A1 | 5/2004 | Hohn et al. |
| 2004/0259279 A1 | 12/2004 | Erchak et al. |
| 2005/0051788 A1 | 3/2005 | Tatsumi et al. |
| 2005/0127385 A1 | 6/2005 | Reeh et al. |
| 2005/0161694 A1 | 7/2005 | Reeh et al. |
| 2005/0231953 A1 | 10/2005 | Reeh et al. |
| 2006/0027831 A1 | 2/2006 | Kioke et al. |
| 2006/0060866 A1 | 3/2006 | Tezen |
| 2006/0157721 A1* | 7/2006 | Tran .................. H01L 33/0079 257/98 |

(56) References Cited

U.S. PATENT DOCUMENTS

| | | |
|---|---|---|
| 2006/0175681 A1 | 8/2006 | Li |
| 2006/0289886 A1 | 12/2006 | Sakai |
| 2007/0020790 A1 | 1/2007 | Erchak et al. |
| 2007/0048885 A1 | 3/2007 | Jeon |
| 2007/0122994 A1 | 5/2007 | Sonobe et al. |
| 2007/0216281 A1 | 9/2007 | Hohn et al. |
| 2008/0149958 A1 | 6/2008 | Reeh et al. |
| 2009/0072264 A1 | 3/2009 | Yoo |
| 2010/0044739 A1 | 2/2010 | Reeh et al. |
| 2010/0127274 A1 | 5/2010 | Yoo |
| 2010/0176344 A1 | 7/2010 | Höhn et al. |

FOREIGN PATENT DOCUMENTS

| | | |
|---|---|---|
| DE | 19625622 | 4/1998 |
| DE | 19638667 | 4/1998 |
| DE | 20009283 | 2/2000 |
| DE | 29724284 | 9/2000 |
| DE | 10022879 | 12/2000 |
| DE | 29724382 | 12/2000 |
| DE | 19945007 | 3/2001 |
| DE | 10010638 | 9/2001 |
| DE | 10020464 | 11/2001 |
| DE | 10026254 | 11/2001 |
| DE | 10026255 | 11/2001 |
| DE | 29724543 | 2/2002 |
| DE | 10042947 | 3/2002 |
| DE | 10044500 | 4/2002 |
| DE | 10051465 | 5/2002 |
| DE | 10203809 | 8/2003 |
| EP | 0622858 | 11/1994 |
| EP | 0862794 | 9/1998 |
| EP | 0907969 | 4/1999 |
| EP | 0936682 | 8/1999 |
| EP | 1111689 | 6/2001 |
| EP | 1150361 | 10/2001 |
| EP | 1198016 | 4/2002 |
| EP | 1451853 | 9/2004 |
| JP | 2091980 | 3/1990 |
| JP | 9008403 | 1/1997 |
| JP | 9320984 | 12/1997 |
| JP | 10177974 | 7/1998 |
| JP | 10190065 | 7/1998 |
| JP | 10294491 | 11/1998 |
| JP | 10319877 | 12/1998 |
| JP | 1 1046015 | 2/1999 |
| JP | 11087770 | 3/1999 |
| JP | 11087778 | 3/1999 |
| JP | 11126923 | 5/1999 |
| JP | 11145519 | 5/1999 |
| JP | 11191641 | 7/1999 |
| JP | 2000-036626 | 2/2000 |
| JP | 2000-196197 | 7/2000 |
| JP | 3065263 | 7/2000 |
| JP | 2000-216434 | 8/2000 |
| JP | 2000-315826 | 11/2000 |
| JP | 2001-053336 | 2/2001 |
| JP | 2001-111109 | 4/2001 |
| JP | 2001-244503 | 9/2001 |
| JP | 2001-339100 | 12/2001 |
| JP | 2002-076523 | 3/2002 |
| JP | 2002-118293 | 4/2002 |
| JP | 2002-151747 | 5/2002 |
| JP | 2003-115614 | 4/2003 |
| KR | 10-2002-0000141 | 1/2002 |
| WO | WO 97/48138 | 12/1997 |
| WO | WO 97/50132 | 12/1997 |
| WO | WO 98/12757 | 3/1998 |
| WO | WO 98/54930 | 12/1998 |
| WO | WO 99/05728 | 2/1999 |
| WO | WO 00/16455 | 3/2000 |
| WO | WO 00/33389 | 6/2000 |
| WO | WO 00/33390 | 6/2000 |
| WO | WO 01/08452 | 2/2001 |
| WO | WO 01/24283 | 4/2001 |
| WO | WO 01/24284 | 4/2001 |
| WO | WO 01/47038 | 6/2001 |
| WO | WO 01/50540 | 7/2001 |
| WO | WO 01/65613 | 9/2001 |
| WO | WO 01/82384 | 11/2001 |
| WO | WO 01/84640 | 11/2001 |
| WO | WO 01/91195 | 11/2001 |
| WO | WO 02/19439 | 3/2002 |
| WO | WO 02/33760 | 4/2002 |
| WO | WO 03/038874 | 5/2003 |

OTHER PUBLICATIONS

Michael Kneissi, et al. "Continuous-Wave Operation of InGaN Multiple-Quantum-Well Laser Diodes on Copper Substrates Obtained by Laser Liftoff", IEEE Journal on Selected Topics in Quantum Electronics, Mar./Apr. 2001, vol. 7, No. 2, pp. 188-191.

William S. Wong, et al., "Continuous-Wave InGaN Multiple-Quantum-Well Laser Diodes on Copper Substrates", Applied Physics Letters, Feb. 26, 2001, vol. 78, No. 9, pp. 1198-1200.

William S. Wong, at al. "The integration of $In_{x}Ga_{1-x}N$ Multiple-Quantum-Well Laser Diodes with Copper Substrates by Laser Lift-Off", Jpn. J. Appl. Phys., Dec. 1, 2000, vol. 39, (2000) pp. L 1203-L 1205, Part 2, No. 12A, pp. L1203-L1205.

Wong, et al., "Integration of InGaN Laser Diodes with Dissimilar Substrates by Laser Lift-Off", Materials Research Society, vol. 639, 2001 pp. G12.2.1-G12.2.5.

Wolf, Stanley, "Silicon Processing for the VLSI Era, vol. 2: Process Integration", Lattice Press, California, 1990.

MK Kelly, et al. "Optical Process for Liftoff of Group III-nitride Films", Physics Status Solidi (a) 1997 vol. 159,pp. R3-R4.

Schraud et al. "Substrateless singlemode vertical cavity surface-emitting GaAs/GaAlAs laser diode", Electronics Letters Online, vol. 30, No. 3, Feb. 3, 1994, pp. 238-239.

Mueller-Mach at al. "White light emitting diodes for illumination", Proceedings of SPIE, vol. 3938, Jan. 26-27, 2000, pp. 30-41.

Schlotter et al. "Fabrication and characterization of GaN/InGaN/Al GaN double heterostructure LEDs and their application in luminescence conversion LEDS", Materials Science and Engineering B59, pp. 390-394, 1999.

Y.H. Lee at al. "Effect of an interlayer on the emission characteristics of a white-light-emitting electroluminescent device with a Pr and Ce doubly doped ZnS phosphor layer", J. Appl. Phys., vol. 70, No. 11, Jun. 1, 1996.

Tanaka et al. "Excitation Mechanism in White-Light Emitting SrS:Pr, K and SrS:Ce, K, Eu Thin-film Electroluminescent Devices", Springer Proceedings in Physics, vol. 38, 1989, pp. 56-59.

Smela et al. "Planar microfabricated polymer light-emitting diodes", Semicond. Sci. Technol., vol. 13, 1998, pp. 433-439.

Jayaraj et al. "Low voltage driven white light emitting thin film EL device", Phys. Stat. Sol. (a), vol. 114, No. 2 Aug. 1989, pp. K233-K238.

Xiu-lai et al. "A novel blue thing film electroluminescent phosphor $Gd_3Ga_5O_{12}$:Ag", Chin. Phys. Lett., vol. 16, Vo. 5, 1999, pp. 387-388.

S. Nakamura and G. Fasol (editors), "The Blue Laser Diode", Chapter 10, InGan Single-Quantum-Well LEDs, Springer-Verlag, New York., 1996.

Stolka, Dr. Milan, "Organic Light Emitting Diodes (OLEDS) for General Illumination: An OIDA Technology Roadmap", Optoelectronics Industry Development Association, Mar. 2001.

Mueller-Mach et al. "High-power phosphor-converted light-emitting diodes based on III-Nitrides", IEEE Journal on Selected Topics in Quantum Electronics, vol. 8, No. 2, Mar./Apr. 2002, pp. 339-345.

Zehnder et al. "Industrial production of GaN and InGaN-light emitting diodes on SiC-substrates", Journal of Crystal Growth, vol. 230, 2001, pp. 497-502.

S. P. Denbaars, "Gallium-Nitride-based Materials for Blue to Ultra violet Optoelectronics Devices", Proceedings of the IEEE, vol. 85, No. 11, Nov. 1997.

Shujji Nakamura, "III-V Nitride based Light-Emitting Devices", Solid State Communications, vol. 102, No. 2-3, pp. 237-248, 1997.

(56) References Cited

OTHER PUBLICATIONS

Baur et al. "White Light Emitting Diodes", Fraunhofer-Institut für Angewandte festkörperphysik, Tullastr. 72, D-79108 Freiburg, pp. 66-78.

Nakamura et al. "Room-temperature continuous-wave operation of InGaN multi-quantum-well-structure laser diodes with a long lifetime", Appl. Phys. Lett., vol. 70, No. 7, Feb. 17, 1997, pp. 868-870.

Agilent Technologies, "Technical Data: T-1¾(5 mm) Precision Optical Performance White LEDs".

R.A. Hewes, "Efficient Infrared Excited Visible Luminescence in Rare Earth Systems", 1970 International Convention Digest, IEEE, Mar. 23-26, 1970.

Burrus et al. "Small-Area, double-heterostructure aluminum-gallium arsenide electroluminescent diode sources for optical-fiber transmission lines", Optics Communications, vol. 4, No. 4, Dec. 1971.

Stocker et al. "Optically pumped InGaN/GaN double heterostructure lasers with cleaved facets", Electronics Letters, vol. 34, No. 4, Feb. 19, 1998, 373-375.

Steigerwald et al. "Illumination with solid state lighting technology", IEEE Journal on Selected Topics in Quantum Electronics, vol. 8, No. 2, Mar./Apr. 2002.

Harle et al. "Advanced Technologies for high efficiency GaInN LEDs for solid state lighting", Third international conference on solid state lighting, Proceedings of SPIE, vol. 5187, 2004.

Harle et al. "Light extraction technologies for high efficiency GaInN-LED devices", Light-emitting diodes: Research, Manufacturing, and Application VII, Proceedings of SPIE, vol. 4996, 2003.

Dunn, Tim et al., "OSTAR—10-Watt LED Application Design", Pre-conference seminar 2, Oct. 17, 2005.

Haerle et al. "High brightness LEDs for general lighting applications using the new ThinGaN Technology," Phys. Stat. Sol. (a), vol. 201, No. 12, pp. 2736-2739, 2004.

\* cited by examiner

THIN FILM LIGHT EMITTING DIODE

This application is a continuation application of U.S. patent application Ser. No. 13/855,637 filed Apr. 2, 2013, now allowed, which is a continuation of U.S. patent application Ser. No. 12/591,165 filed Nov. 10, 2009, now U.S. Pat. No. 8,445,921, which is a continuation of U.S. patent application Ser. No. 11/978,680 filed Oct. 30, 2007, now U.S. Pat. No. 7,649,210, which is a continuation of U.S. patent application Ser. No. 10/975,095 filed Oct. 28, 2004, now U.S. Pat. No. 7,691,650, which is a divisional of U.S. patent application Ser. No. 10/179,010 filed Jun. 26, 2002, now U.S. Pat. No. 6,841,802, all of which are incorporated by reference in their entirety for all purposes as if fully set forth herein.

BACKGROUND OF THE INVENTION

Field of the Invention

The present invention relates to diodes (LEDs), and more particularly, present invention relates to light emitting diodes LEDs.

Discussion of the Related Art

Light emitting diodes LEDs are well-known semiconductor devices that convert electrical current into light. An LED produces light by exciting electrons across the band gap between a conduction band and a valence band of a semiconductor active (light-emitting) layer. The electron transition generates light at a wavelength (color) that depends on the band gap. Thus, the color of the light (wavelength) emitted by an LED depends on the semiconductor material(s) of the active layer.

LEDs are widely available in a range of colors, for example, red, green, blue, yellow, and orange. However, conventional LEDs are relatively monochromatic light sources. Unfortunately, some applications require white light, which includes all primary colors. For example, laptop computers often require white-light backlights. Usually, white light is supplied either by incandescent bulbs or by fluorescent lamps. Although inexpensive, incandescent bulbs have fairly short lifetimes and low luminous efficiency. While more efficient, fluorescent lamps also tend to have limited lifetimes. Furthermore, fluorescent lamps require relatively large, heavy and expensive support devices, such as voltage stabilizers.

A white LED source could be made by fabricating closely spaced (or otherwise light-mixed) red, green, and blue LEDs that emit light in proper proportions. However, blue LEDs have been relatively difficult to fabricate, primarily because of difficulties in fabricating high quality crystals having a suitable band gap. Despite these difficulties, blue GaN-based LEDs have recently become commercially available. This has enabled white LEDs to actually be fabricated by mixing green, red and blue light together.

While successful in producing white light, three-component (green, red and blue) LEDs have problems. For example, three-component LEDs will use significantly more power than a single component LED. Additionally, three-component LEDs require careful balancing of optical outputs to achieve high quality white light, a balance that is difficult to maintain over time and temperature, and that requires careful and expensive fabrication. The necessity of optical balancing combined with a relatively complicated drive circuitry means that three-component LEDs are, in practice, difficult and expensive to fabricate.

Because of the forgoing problems with three-component LEDs it is would be advantageous to produce white light using only a single-element LED. Such single element white LEDs are known. For example, FIG. 1 illustrates a prior art single-element, white LED 12. The LED 12 incorporates an yttrium-aluminum garnet (YAG) phosphor. Essentially, the phosphor layer produces white light from blue light. As shown, the single element white LED 12 is comprised of a blue LED chip 14 that is located on a base 15, which is inside an organic YAG phosphor 16. The YAG phosphor 16 is embedded in a dome-shaped package 17 having a hemispherical top 18. The package 17 protects the resulting LED from damage caused by static electricity, moisture, and other environmental influences. Extending from the package 17 are two leads 20 and 22. Bonding wires 24 and 26 connect the anode and cathode of the LED chip 14 to the leads 20 and 22.

Still referring to FIG. 1, when electric power is applied to the LED chip 14 via the leads 20 and 22 and the bonding wires 24 and 26, the LED chip 14 emits blue light. A part of the blue light passes through the YAG phosphor 16, while another part is absorbed by the YAG phosphor 16. The result is white light from the package 17.

Thus, a key to making white LEDs using the method illustrated in FIG. 1 is suitable blue LEDs. A beneficial approach to fabricating such blue LEDs is to incorporate active layers comprised of Gallium-Nitride (GaN) and Indium to produce InGaN/GaN semiconductor layers. In fact, the energy efficiency of GaN-based white LEDs has surpassed that of incandescent lamps, and is now comparable with that of fluorescent lamps.

Despite their numerous advantages, white LEDs similar to the one shown in FIG. 1 have problems. One set of problems relates to degradation of the bonding wires 24 and 26, the LED chip 14, and the leads 20 and 22 due to direct contact and subsequent chemical reaction with the YAG phosphor 16. Additionally, the YAG phosphor 16 can be degraded by such chemical reactions.

Another problem with white LEDs similar to the one shown in FIG. 1 is that the hemispherical top 18 of the package 17 results in a "ring pattern" in the emitted light. Thus, the emitted light has poor luminance uniformity. The hemispherical top 18 also makes it difficult to reliably coat phosphors inside the package if such coating is required.

Another problem with white LEDs similar to the one shown in FIG. 1 is that the actual production of white light does not come from the light-producing LED chip 14, which emits only blue light, but from phosphor 16 within the package 17. Thus, the package not only provides protection, it is a functional requirement. Thus, the foregoing technique is not well suited for use with surface mount packaging.

U.S. Pat. No. 6,337,536, by inventors Matsubara et al., which issued on Jan. 8, 2002, and which is entitled, "White color light emitting diode and neutral color light emitting diode," discloses a white light emitting source that uses an n-type ZnSe single crystal substrate. The substrate is doped with I, Cl, Br, Al, Ga, or In emission centers, and includes an epitaxial film active layer structure of ZnSe, ZnCdSe or ZnSeTe. The active layer emits blue or blue-green light. The emission centers convert the blue or blue-green light to yellow or orange. The blue or blue-green light and the yellow or orange light synthesize white light or a neutral color light between red and blue.

While the techniques taught in U.S. Pat. No. 6,337,536 are generally successful, they have problems. For example, U.S. Pat. No. 6,337,536 teaches a thick substrate. Therefore, the light intensity is heavily dependent on the thickness of the substrate. Furthermore, the materials used in U.S. Pat. No. 6,337,536 may not be optimal in specific applications.

Therefore, a new single-element, white LED would be beneficial. Particularly beneficial would be a single-element, white LED that reduces or eliminates bonding wire, LED chip, connector lead, and phosphor degradation. Also beneficial would be a single-element, white LED that does not produce a ring pattern and that improves the uniformity of emitted light. Such a single-element, white LED would beneficially be fabricated as an on-chip, single-element, white LED that does not require a package for white light emissions. A method of fabricating white light emitting diodes without coating phosphor inside packages would be useful. Also beneficial would be a single-element, white LED with a light output that does not depend on the thickness of a substrate. More generally, a method of fabricating light emitting diodes using thin film fluorescent coatings would be beneficial.

BRIEF SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

The principles of the present invention provide for white LEDs and for methods of fabricating white LEDs. Embodiments of white LEDs that are in accord with the principles of the present invention have reduced or eliminated bonding wire, LED chip, lead, and/or phosphor degradation. Such white LEDs can be fabricated on-chip, with improved light uniformity, and in such a manner that the light output is not heavily dependent on the thickness of a substrate.

According to the broad principles of the present invention, an LED element that produces light at a first wavelength and having p and n contacts is fabricated on a substrate. Then, a tinted thin film covers the LED element. A passivation layer is located on the LED element, but in such a manner that the p and n contact pads are exposed. Electrical power applied to the p and n contacts causes the LED element to emit light at the first wavelength. The thin film converts light at the first wavelength to at least a second wavelength.

According to the principles of the present invention a white LED includes a blue-LED element that includes p and n contact pads. A thin film material, such as a phosphor (like YAG) or a tin-containing compound, covers the blue-LED element. Such thin film materials are beneficially formed using metal organic chemical vapor deposition (MOCVD), atomic layer chemical vapor deposition (ALD), plasma enhanced MOCVD, plasma enhanced ALD, photo enhanced CVD, or other chemical vapor deposition methods.

A passivation layer, beneficially about a 1000 Å-thick $SiO_2$ or $Si_xN_y$ layer, can be located on the blue-LED element, but in such a manner that the p and n contact pads are exposed. The passivation layer can be formed using PECVD, sputtering, electron beam evaporation, or coating with a material, such as epoxy or flowable $SiO_2$. PECVD is particularly beneficial in that it provides protected sidewalls. Spin-coating is a useful method of material coating. The passivation layer can then be patterned to expose the p and n contact pads using photolithography and a suitable etchant (such a BOE, HF, and/or photo-resist stripping).

Wire bonds connect to the p and n contact pads. A second passivation layer can be formed over the p and n pads, over ends of the wire bonds, and over the first passivation layer. The result is an on-chip, single-element, white LED that is capable of emitting white-light without being encapsulated. Furthermore, an on-chip, single-element, white LED can be formed without a ring-patterned light. However, the resulting on-chip, single-element, white LED could be encapsulated in a package (such as a lamp or surface mount package) as required.

According to the principles of the present invention, an LED includes an LED element that includes p and n contact pads and that emits light at a first wavelength. A fluorescent thin film material (such as a phosphor or a tin-containing material) covers the LED element. Such thin film materials are beneficially formed using metal organic chemical vapor deposition (MOCVD), atomic layer chemical vapor deposition (ALD), plasma enhanced MOCVD, plasma enhanced ALD, photo enhanced CVD, or other chemical vapor deposition methods. A passivation layer, beneficially about a 1000 Å-thick $SiO_2$ or $Si_xN_y$ layer, can be located on the LED element, but in such a manner that the p and n contact pads are exposed. The fluorescing material converts light emitted by the LED element into at least a second wavelength.

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the spirit and scope of the invention will become apparent to those of skill in the art from the detailed description of the invention and claims that follow.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE ILLUSTRATED EMBODIMENTS

The following generally describes a process for fabricating on-chip white LEDs. While that description is an advantageous method of fabricating white LEDs, the principles of the present invention are not limited to that described method. Accordingly, the present invention is to be limited only by the claims that follow as understood and interpreted according to United States Patent Laws.

Figure 1:
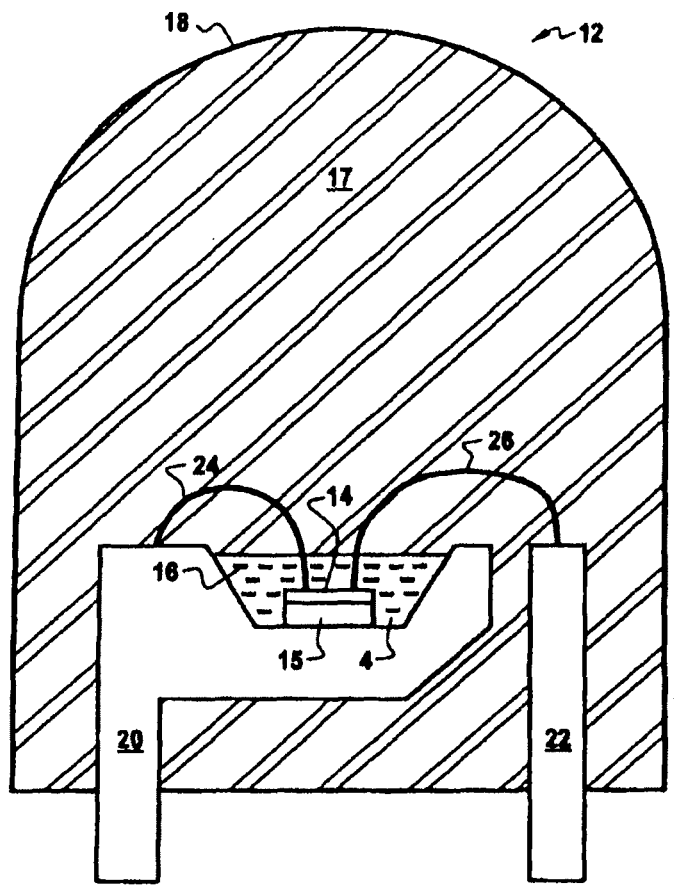
FIG. 1 illustrates a prior art white LED.
Figure 2:
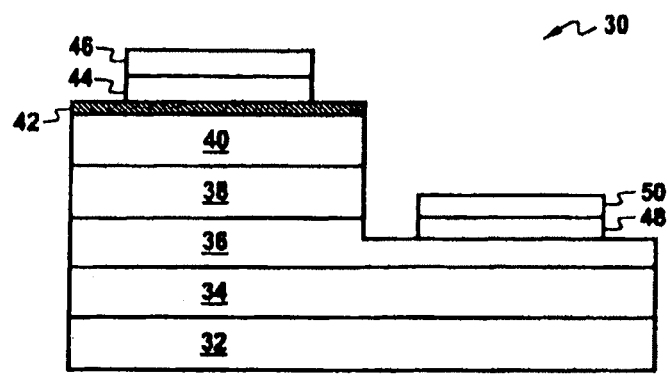
FIG. 2 illustrates a prior art lateral topology blue LED.
Figure 3:
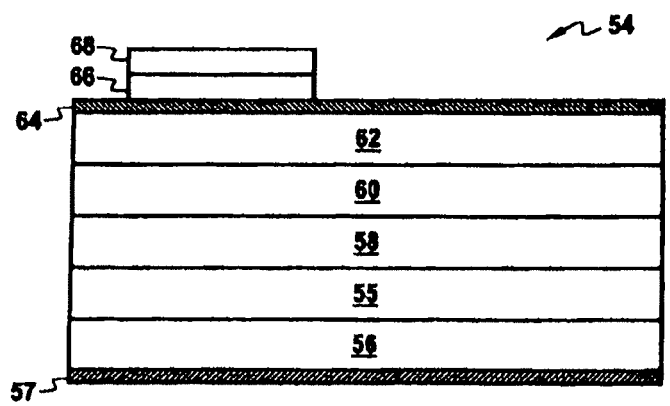
FIG. 3 illustrates a prior art vertical topology blue LED.

Fabrication of a white light emitting diode that is in accord with the principles of the present invention begins with procurement of, such as by fabrication, a blue-LED chip having p and n contact pads. FIGS. 2 and 3 illustrate suitable blue-LED chips. In particular, FIG. 2 illustrates a lateral topology blue-LED chip 30 that is fabricated on a sapphire substrate 32. An n-GaN buffer layer 34 is formed on the substrate 32. A relatively thick n-GaN epitaxial layer 36 is then formed on the buffer layer 34. An active layer 38 having multiple quantum wells of aluminum-indium-gallium-nitride (AlInGaN) or of InGaN/GaN is then formed on the n-type GaN epitaxial layer 36. A p-GaN layer 40 is then formed on the active layer 38. A transparent conductive layer 42 is then formed on the p-GaN layer 40. The transparent conductive layer 42 may be made of any suitable material, such as Ru/Au, Ni/Au or indium-tin-oxide (ITO). A p-type electrode 44 is then formed on one side of the transparent conductive layer 42. Suitable p-type electrode materials include Ni/Au, Pd/Au, Pd/Ni and Pt. A p contact pad 46 is then formed on the p-type electrode 44. Beneficially, the p contact pad 46 is Au. The transparent conductive layer 42, the p-GaN layer 40, the active layer 38 and part of the n-GaN layer 36 are then etched to form a step. Because of the difficulty of wet etching GaN, a dry etch is beneficially usually used to form the step. The LED 30 is then completed by forming an n-electrode pad 48 (such as Cr or Au) and an n contact pad 50 (such as Au) on the step.

FIG. 3 illustrates an alternative blue LED, specifically a vertical topology GaN-based LED 54. An example of this alternative blue LED structure is disclosed in U.S. application Ser. No. 09/905,969 entitled "DIODE HAVING HIGH BRIGHTNESS AND METHOD THEREOF" filed on Jul. 17, 2001, and U.S. application Ser. No. 09/983,994 entitled "DIODE HAVING VERTICAL STRUCTURE AND METHOD OF MANUFACTURING THE SAME" filed on Oct. 26, 2001, both of which are incorporated in this application as if fully set forth herein. The LED 54 is partially fabricated on a sapphire substrate that is subsequently removed. Removal of sapphire substrate may be done by, for example, laser lift-off. As shown, the LED 54 includes a GaN buffer layer 55 having an n-metal contact 56 on a bottom surface and a relatively thick n-GaN layer 58 on the other. The n-metal contact 56 is beneficially formed from a high reflective layer that is overlaid by a high conductivity metal (beneficially Au) to form an n contact pad 57. An active layer 60 having a multiple quantum well is formed on the n-type GaN layer 58, and a p-GaN layer 62 is formed on the active layer 60. A transparent conductive layer 64 is then formed on the p-GaN layer 62, and a p-type electrode 66 is formed on the transparent conductive layer 64. A p contact pad 68 is then formed on the p-type electrode 66.

The vertical GaN-based LED 54 has advantages in that step etching is not required. However, to locate the n-metal contact 56 below the GaN buffer layer 55, the sapphire substrate (not shown) that is used for initial GaN growth is removed. Sapphire substrate removal using laser lift-off is known, reference U.S. Pat. No. 6,071,795 to Cheung et al., entitled, "Separation of Thin Films From Transparent Substrates By Selective Optical Processing," issued on Jun. 6, 2000, and Kelly et al. "Optical process for liftoff of group HI-nitride films", Physica Status Solidi (a) vol. 159, 1997, pp. R3-R4). Furthermore, highly advantageous methods of fabricating GaN semiconductor layers on sapphire (or other insulating and/or hard) substrates are taught in U.S. patent application Ser. No. 10/118,317 entitled "A Method of Fabricating Vertical Devices Using a Metal Support Film" and filed on Apr. 9, 2002 by Myung Cheol Yoo, and in U.S. patent application Ser. No. 10/118,316 entitled "Method of Fabricating Vertical Structure" and filed on Apr. 9, 2002 by Lee et al. Additionally, a method of etching GaN and sapphire (and other materials) is taught in U.S. patent application Ser. No. 10/118,318 entitled "A Method to Improve Light Output of GaN-Based Light Emitting Diodes" and filed on Apr. 9, 2002 by Yeom et al., all of which are hereby incorporated by reference as if fully set forth herein.

In principle, the vertical GaN-based LED 54 is preferred. Reasons for this include the fact that a 2" diameter sapphire wafer has the potential to produce about 35,000 vertical GaN-based LEDs, but only about 12,000 lateral GaN-based LEDs. Furthermore, the lateral topology is more vulnerable to static electricity, primarily because the two electrodes/pads (44/46 and 48/50) are close together. Additionally, as the lateral topology is fabricated on an insulating substrate, and as the vertical topology can be attached to a heat sink, the lateral topology has relatively poor thermal dissipation.

While the vertical GaN-based LED 54 will be preferred in many applications, at the present time, lateral topology blue LED chips 30 are more common. Furthermore, the principles of the present invention are fully applicable to both types of blue LEDs (as well as with hybrids and variations). Therefore, without implying any loss of generality, the subsequent description of the fabrication of single-element white LEDs will make specific reference to the use of a lateral blue-LED chip 30.

Figure 4:
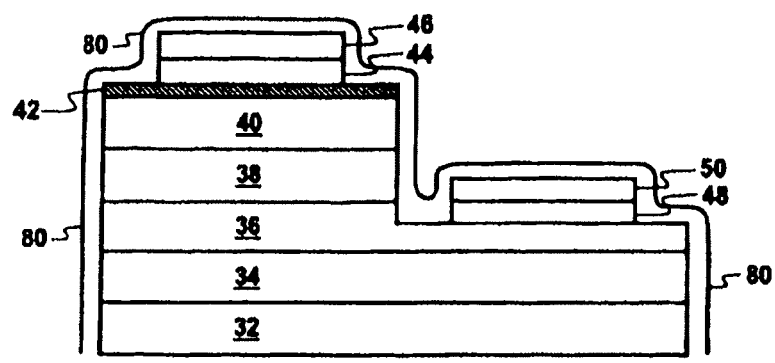
FIG. 4 illustrates a vertical topology, blue LED after coating with a passivation material.

Referring now to FIG. 4, a passivation layer 80 is formed over the blue LED chip 30. A suitable passivation layer 80 may be an $SiO_2$ or $Si_xN_y$ layer of 1000 Å-thick, for example, formed on exposed surfaces of the LED chip 30 using PECVD. Alternatively, the passivation layer 80 may be formed by sputtering, electron beam evaporation, or by coating with a suitable protective material, such as epoxy or flowable $SiO_2$. Note that spin-coating is a particularly useful coating technique. However, PECVD is beneficial because it can form the passivation layer 80 on the sidewalls of the blue LED chip 30.

Figure 5:
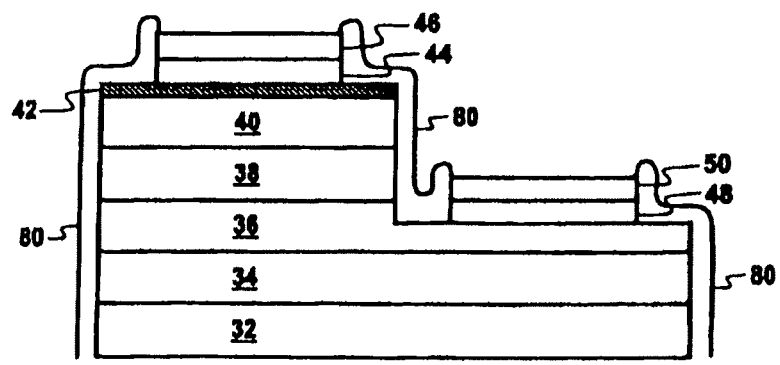
FIG. 5 illustrates the LED of FIG. 4 after patterning of the passivation material.

Referring now to FIG. 5, the passivation layer 80 is then patterned to expose the p and n contact pads 46 and 50 using a suitable etchant. For example, BOE, HF, and/or photo-resist stripping can be used to expose the pads.

Figure 6:
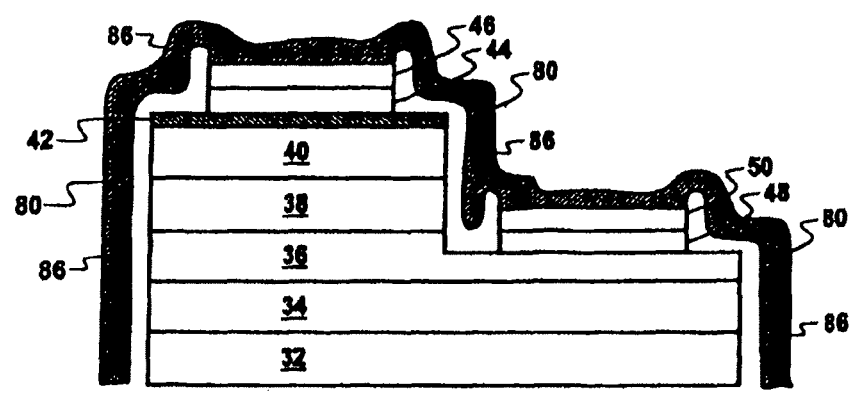
FIG. 6 illustrates the LED of FIG. 5 after forming of a thin film.

Then, as shown in FIG. 6, a thin film layer 86 of, for example, a fluorescent material (such as phosphor or a tin-containing compound) is formed on the passivation layer 80 so as to cover the blue LED element. Other suitable materials can be used for the thin film layer 86 to convert a light of first wavelength (a first color) to a light of second wavelength (a second color). Here, if a blue LED is used and coated with a phosphor thin film, for example, in accordance with the present invention, the blue light would be converted to white light by the phosphor, thus producing an "on-chip" white LED. Using different color LEDs and different color influencing materials would result in different colors produced directly from the chip.

The thin film layer is beneficially formed using metal organic chemical vapor deposition (MOCVD), atomic layer chemical vapor deposition (ALD), plasma enhanced MOCVD, plasma enhanced ALD, photo enhanced CVD, or other chemical vapor deposition methods. Preferably, the thin film layer 86 is about 10 μm or so thick. Thus, the thin film layer 86 is an integral element of the chip, and not part of a package. Regarding the film thickness, in general the thinner the better. The thickness can be reduced by growing dense thin film layers.

Figure 7:
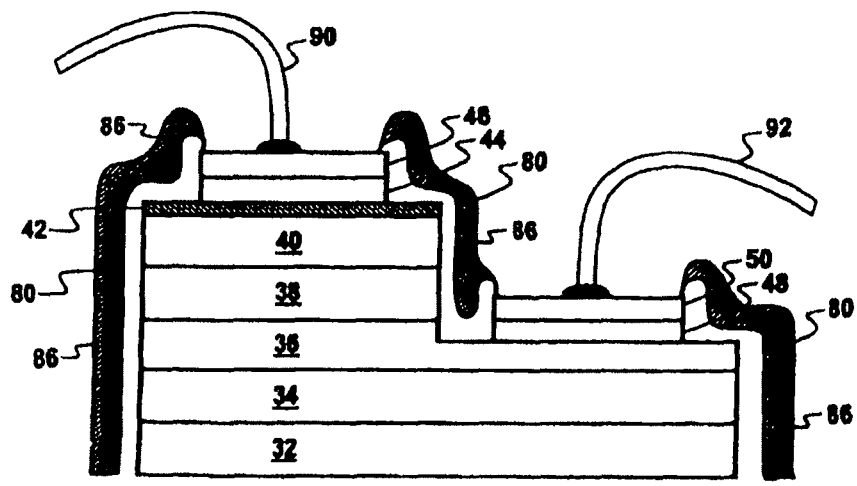
FIG. 7 illustrates the LED of FIG. 6 after patterning of the thin film and after bonding wires are connected.

Referring now to FIG. 7, the thin film layer 86 is patterned to expose the p and n contact pads 46 and 50 using a suitable solvent (which will depend on the composition of the thin film layer 86). Bonding wires 90 and 92 are then bonded to the p and n contact pads 46 and 50, respectively.

Figure 8:
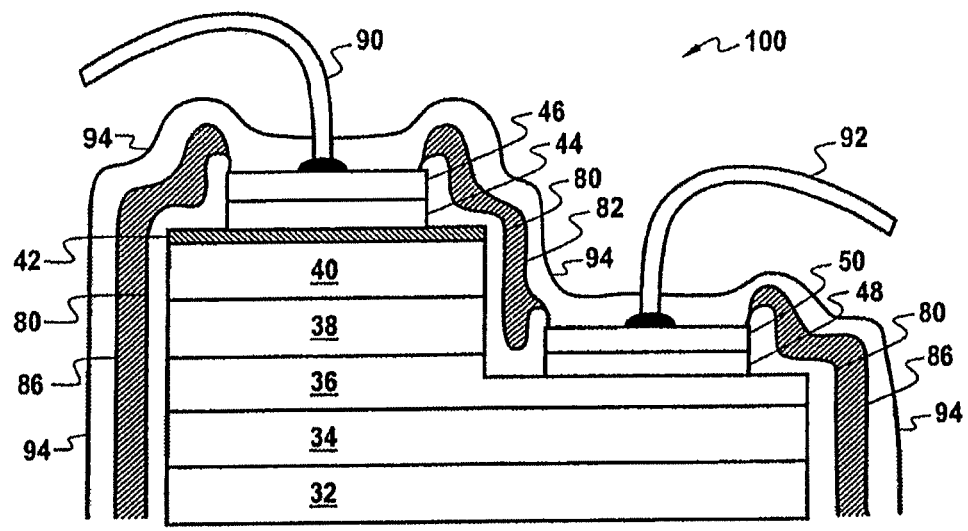
FIG. 8 illustrates the LED of FIG. 7 after a second coating of a passivation material.

Referring now to FIG. 8, an optional second passivation layer 94 (which is optically transparent) is then formed over the structure of FIG. 7. Beneficially the first and second passivation layers 80 and 94 are formed using the same process. The result is a white LED 100.

The white LED 100 can then be encapsulated into a package, such as a lamp package or a surface mount package. However, the white LED 100 also can be used unpackaged and/or as part of another assembly.

Figure 9:
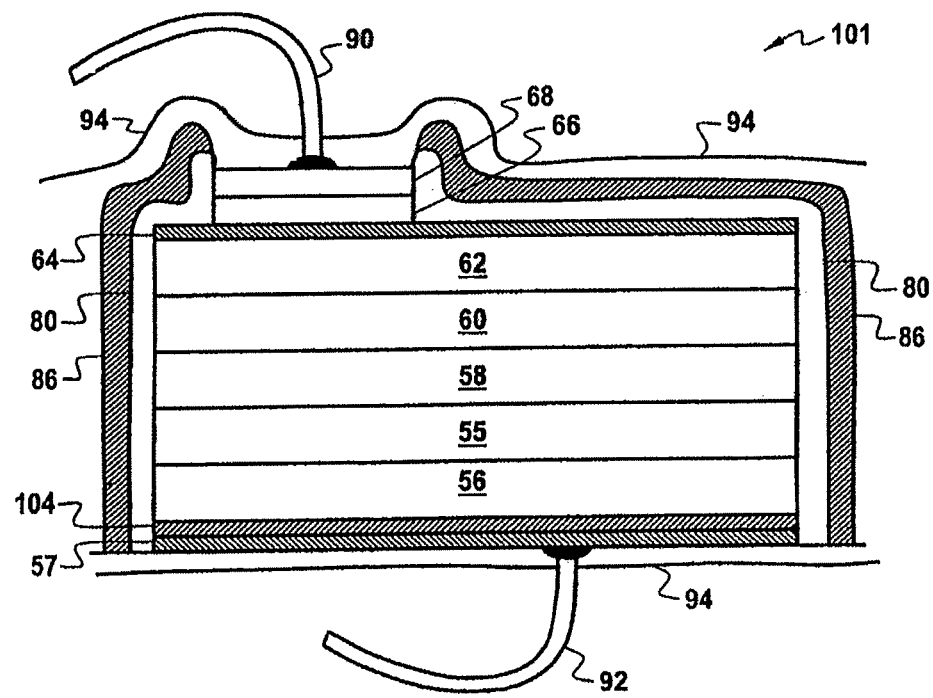
FIG. 9 illustrates an alternative embodiment LED that is in accord with the principles of the present invention.

In some applications it will be beneficial to incorporate a reflector between a contact pad and an adjacent semiconductor layer. For example, as shown in FIG. 9, if a vertical LED 54 is used as the blue light source for a white LED 101, it might be advantageous to incorporate a reflective layer 104 between the n-metal contact 56 and the n contact pad 57. In that case, it is advantageous to include the second passivation layer 94 under the n contact pad 57 after the bonding wire 92 is attached. Likewise, the second passivation layer 94 is beneficially over the p contact pad 68. However, is should be understood that in all cases the second passivation layer 94 is optional.

The foregoing embodiments have described new, useful, and nonobvious white LEDs 101. However, the general principles of depositing thin films that change the color of input light, such as by a thin film material, are applicable to more than just white LEDs. It is entirely possible to implement LEDs that emit other then white light by depositing various thin film materials on LEDs that emit light of different colors. Therefore, while the embodiments and examples set forth herein are presented to best explain the present invention and its practical application and to thereby enable those skilled in the art to make and utilize the invention, others who are skilled in the art will recognize that the foregoing description and examples have been presented for the purpose of illustration and example only.

What is claimed is:

1. A vertical light emitting diode structure, comprising:
a conductive substrate;
a p-electrode on the conductive substrate;
a p-GaN layer on the p-electrode;
an active layer emitting light and on the p-GaN layer;
an n-GaN layer on the active layer;
a phosphor layer and an n-electrode on the n-GaN layer; and
a passivation layer disposed between the n-GaN layer and the phosphor layer,
wherein the phosphor layer is parallel to the n-GaN layer and has a two-digit micrometer thickness.

2. The vertical light emitting diode structure of claim 1, wherein the conductive substrate is deposited using at least one of electroplating, electro-less plating, CVD, and sputtering, and
wherein the conductive substrate comprises at least one of Cu, Cr, Ni, Au, Ag, Mo, Pt, Pd, W, or Al, or alloys thereof.

3. The vertical light emitting diode structure of claim 1, further comprising a reflective layer between the p-electrode and the p-GaN layer.

4. The vertical light emitting diode structure of claim 1, wherein the phosphor layer is an integral element of the chip, and not part of a package.

5. The vertical light emitting diode structure of claim 1, wherein the phosphor layer is patterned.

6. The vertical light emitting diode structure of claim 1, wherein the phosphor layer comprises various materials that emit light of different colors.

7. The vertical light emitting diode structure of claim 1, further comprising an n-electrode pad to bond a wire on the n-electrode coupled to the n-GaN layer through the phosphor layer.

8. The vertical light emitting diode structure of claim 7, wherein the phosphor layer contacts the n-electrode pad.

9. The vertical emitting diode structure of claim 1, wherein the passivation layer comprises at least one of $SiO_2$, SiN, $Si_3N_4$, or epoxy, and has a four-digit angstrom thickness.

10. The vertical emitting diode structure of claim 1, wherein the n-electrode comprises at least one of Ti or Al.

11. A vertical light emitting diode structure, comprising:
a conductive substrate;
a first electrode on the conductive substrate;
a GaN based semiconductor structure comprising a first type GaN layer on the first electrode, an active layer on the first type GaN layer, and a second type GaN layer on the active layer;
a passivation layer and a second electrode on the second type GaN layer; and
a phosphor layer on the passivation layer and the second electrode, the passivation layer being disposed between the second type GaN layer and the phosphor layer,
wherein the phosphor layer is parallel to the conductive substrate,
wherein the phosphor layer is patterned to bond a wire, and
wherein the phosphor layer is thicker than the GaN based semiconductor structure.

12. The vertical light emitting diode structure of claim 11, wherein the phosphor layer comprises different phosphor materials that emit light of different colors.

13. The vertical light emitting diode structure of claim 11, wherein the phosphor layer is thicker than the passivation layer.

14. The vertical light emitting diode structure of claim 11, wherein the conductive substrate comprises at least one of Cu, Cr, Ni, Au, Ag, Mo, Pt, Pd, W, or Al, or alloys thereof.

15. A vertical light emitting diode structure, comprising:
a conductive substrate;
a p-electrode on the conductive substrate;
a GaN based semiconductor structure comprising a p-GaN layer on the p-electrode, an active layer on the p-GaN layer, and an n-GaN layer on the active layer;
a passivation layer and an n-electrode on the n-GaN layer; and
a phosphor layer on the passivation layer and the n-electrode, the passivation layer being disposed between the n-GaN layer and the phosphor layer,
wherein the phosphor layer is parallel to the conductive substrate,
wherein the phosphor layer comprises different phosphor materials that emit light of different colors,
wherein the phosphor layer is thicker than the GaN based semiconductor structure, and
wherein the passivation layer includes an opening on a top surface of n-GaN layer such that the opening accommodates at least a portion of the n-electrode.

16. The vertical light emitting diode structure of claim 15, wherein the phosphor layer is patterned to bond a wire, and wherein the phosphor layer is thicker than the passivation layer.

17. The vertical light emitting diode structure of claim 15, wherein the phosphor layer is thicker than the passivation layer.

18. A vertical light emitting diode structure, comprising:
a substrate;
a semiconductor structure on the substrate, the semiconductor structure comprising a first-type semiconductor layer, an active layer on the first-type semiconductor layer, and a second-type semiconductor layer on the active layer, the semiconductor structure further including a top surface, a bottom surface, and a side surface between the top surface and the bottom surface;
a metal contact layer in contact with the first-type semiconductor layer;
a reflective layer on the metal contact layer for reflecting light emitted from the semiconductor structure;
an electrode on the top surface of the semiconductor structure;
a passivation layer extended from the reflective layer to the top surface of the semiconductor structure via the side surface of the semiconductor structure, the passivation layer including an opening on the top surface of the semiconductor structure such that the opening accommodates at least a portion of the electrode; and
a wavelength converting layer on the passivation layer.

19. The vertical light emitting diode structure according to claim 18, wherein the wavelength converting layer includes an opening for a wire to electrically connect to the electrode, and
wherein both the opening of the wavelength converting layer and the opening of the passivation layer overlap each other.

20. The vertical light emitting diode structure according to claim 19, further comprising a transparent layer covering both the passivation layer and the wavelength conversion layer,
wherein a space where both the opening of the wavelength converting layer and the opening of the passivation layer overlap each other is filled with the transparent layer.

21. The vertical light emitting diode structure according to claim 18, further comprising a transparent conductive layer on the second-type semiconductor layer,
wherein the first-type semiconductor layer is an n-type semiconductor layer, and
wherein the second-type semiconductor layer is a p-type semiconductor layer.

* * * * *